(12) United States Patent
Yang

(10) Patent No.: US 9,627,544 B2
(45) Date of Patent: Apr. 18, 2017

(54) METHOD OF FORMING SEMICONDUCTOR DEVICE

(71) Applicant: United Microelectronics Corp., Hsinchu (TW)

(72) Inventor: Po-Yu Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/817,577

(22) Filed: Aug. 4, 2015

(65) Prior Publication Data
US 2017/0040465 A1    Feb. 9, 2017

(51) Int. Cl.
| | | |
|---|---|---|
| H01L 29/775 | (2006.01) | |
| H01L 21/84 | (2006.01) | |
| H01L 29/786 | (2006.01) | |
| H01L 21/8238 | (2006.01) | |
| H01L 29/423 | (2006.01) | |
| H01L 29/10 | (2006.01) | |
| H01L 29/78 | (2006.01) | |
| H01L 29/06 | (2006.01) | |

(52) U.S. Cl.
CPC ........... *H01L 29/78684* (2013.01); *H01L 21/823807* (2013.01); *H01L 21/823814* (2013.01); *H01L 21/84* (2013.01); *H01L 29/0673* (2013.01); *H01L 29/1054* (2013.01); *H01L 29/42392* (2013.01); *H01L 29/7848* (2013.01); *H01L 29/78618* (2013.01); *H01L 29/78696* (2013.01)

(58) Field of Classification Search
CPC .............. H01L 29/775; H01L 29/0669; H01L 29/0673; H01L 27/092; H01L 21/02532; H01L 29/16; H01L 29/7848; H01L 29/0665; B82Y 10/00
USPC ........................................................ 438/195
See application file for complete search history.

(56) References Cited

U.S. PATENT DOCUMENTS

| | | | |
|---|---|---|---|
| 6,492,215 B1* | 12/2002 | Kishi | H01L 21/82385 257/E21.639 |
| 7,902,541 B2 | 3/2011 | Sekaric et al. | |
| 7,923,314 B2 | 4/2011 | Tezuka et al. | |
| 8,901,672 B1 | 12/2014 | Cheng et al. | |
| 2011/0233522 A1* | 9/2011 | Cohen | H01L 29/0673 257/24 |
| 2012/0007051 A1* | 1/2012 | Bangsaruntip | B82Y 10/00 257/24 |

(Continued)

*Primary Examiner* — Caridad Everhart
(74) *Attorney, Agent, or Firm* — J.C. Patents

(57) ABSTRACT

A method of forming a semiconductor device is disclosed. At least one suspended first semiconductor nanowire and two first semiconductor blocks at two ends of the first semiconductor nanowire are formed in a first area, and at least one suspended second semiconductor nanowire and two second semiconductor blocks at two ends of the second semiconductor nanowire are formed in a second area. A transforming process is performed, so the first semiconductor nanowire is transformed into a nanowire with stress, and the second semiconductor blocks are simultaneously transformed into two blocks with stress. First and second gate dielectric layers are formed respectively on surfaces of the nanowire with stress and the second semiconductor nanowire. First and second gates are formed respectively across the nanowire with stress and the second semiconductor nanowire.

18 Claims, 9 Drawing Sheets

(56) References Cited

U.S. PATENT DOCUMENTS

2013/0017673 A1* 1/2013 Bangsaruntip ......... B82Y 10/00
438/479

* cited by examiner

METHOD OF FORMING SEMICONDUCTOR DEVICE

FIELD OF THE PRESENT INVENTION

The present invention relates to an integrated circuit fabrication, and particularly to a method of forming a semiconductor device.

DESCRIPTION OF RELATED ART

In the field of integrated circuit devices, the dimensions of the devices are often reduced to attain a higher operating speed and a lower power consumption. However, with the ever-increasing level of integration of devices, the miniaturization of devices has almost reached its limit.

In recent years, a multi-gate structure such as a fin field effect transistor (FinFET) device or a nanowire FET device is proposed to overcome the limitations imposed by the device miniaturization. Besides, strain engineering such as controlling the stress in the channel region of a transistor is also adopted. However, when an N-type device and a P-type device are required to form on the same chip, the process for fabricating the N-type device is commonly separated from the process for fabricating the P-type device. Therefore, multiple photo-masks and complicated process steps are required, so as to increase the process cost and reduce the competitiveness in the market.

SUMMARY OF THE PRESENT INVENTION

Accordingly, the present invention provides a method of forming a semiconductor structure, in which the tensile stress for an N-type channel and the compression stress for a P-type channel can be simultaneously generated with the simple process steps of the invention.

The present invention further provides a method of forming a semiconductor device. At least one suspended first silicon-based nanowire and two first silicon-based blocks at two ends of the first silicon-based nanowire are formed in a first area, and at least one suspended second silicon-based nanowire and two second silicon-based blocks at two ends of the second silicon-based nanowire are formed in a second area. A germanium-based semiconductor layer is formed on a surface of the first silicon-based nanowire and on surfaces of the second silicon-based blocks. Germanium atoms of the germanium-based semiconductor layer are driven into underlying layers, so the first silicon-based nanowire is transformed into a germanium-based nanowire and the second silicon-based blocks are transformed into two germanium-based blocks. First and second gate dielectric layers are formed respectively on surfaces of the germanium-based nanowire and the second silicon-based nanowire. At least one first gate is formed across the germanium-based nanowire, and at least one second gate is formed across the second silicon-based nanowire.

According to an embodiment of the present invention, the step of forming the germanium-based semiconductor layer on the surface of the first silicon-based nanowire and on the surfaces of the second silicon-based blocks includes forming a mask layer on surfaces of the first silicon-based blocks and on a surface of the second silicon-based nanowire, performing a selective epitaxial growth (SEG) process, and removing the mask layer.

According to an embodiment of the present invention, the mask layer includes an oxide layer or a nitride layer.

According to an embodiment of the present invention, the step of driving the germanium atoms of the germanium-based semiconductor layer into the underlying layers includes performing a high-temperature oxidation, a rapid thermal annealing (RTA) or a laser annealing.

According to an embodiment of the present invention, the germanium-based semiconductor layer includes germanium or silicon germanium.

According to an embodiment of the present invention, the step of forming the first silicon-based nanowire, the first silicon-based blocks, the second silicon-based nanowire and the second silicon-based blocks includes the following steps. At least one stripe-shaped insulating pattern is formed on a substrate in each of the first and second areas. A hard mask layer is formed on the substrate covering the stripe-shaped insulating patterns. Two photoresist blocks are formed corresponding to two ends of each of the stripe-shaped insulating patterns. A portion of the hard mask layer is removed by using the photoresist blocks as a mask, so as to form two mask spacers beside each stripe-shaped insulating pattern and define two mask blocks below the photoresist blocks. The photoresist blocks and the stripe-shaped insulating patterns are removed. A portion of the substrate is removed by using the mask spacers and the mask blocks as a mask. The mask spacers and the mask blocks are removed to form the first and second silicon-based nanowires and the first and second silicon-based blocks. Another portion of the substrate below the first and second silicon-based nanowires is removed.

According to an embodiment of the present invention, the substrate includes a silicon-on-insulator (SOI) substrate.

According to an embodiment of the present invention, the first area is an N-type device area, and the second area is a P-type device area.

According to an embodiment of the present invention, the first silicon-based blocks serve as source/drain regions of an N-type device, and the germanium-based blocks serve as source/drain regions of a P-type device.

The present invention further provides a method of forming a semiconductor device. At least one suspended first semiconductor nanowire and two first semiconductor blocks at two ends of the first semiconductor nanowire are formed in a first area, and at least one suspended second semiconductor nanowire and two second semiconductor blocks at two ends of the second semiconductor nanowire are formed in a second area. A transforming process is performed, so the first semiconductor nanowire is transformed into a nanowire with stress, and the second semiconductor blocks are simultaneously transformed into two blocks with stress. First and second gate dielectric layers are formed respectively on surfaces of the germanium-based nanowire and the second silicon-based nanowire. First and second gates are formed respectively across the germanium-based nanowire and the second silicon-based nanowire.

According to an embodiment of the present invention, the transforming process includes forming an oxide layer on surfaces of the first semiconductor blocks and on a surface of the second semiconductor nanowire, forming a germanium-based semiconductor layer on a surface of the first semiconductor nanowire and on surfaces of the second semiconductor blocks, removing the oxide layer, and driving germanium atoms of the germanium-based semiconductor layer into underlying layers.

According to an embodiment of the present invention, a method of forming the germanium-based semiconductor layer includes performing a selective epitaxial growth (SEG)

process, a chemical vapor deposition (CVD) process, a physical vapor deposition (PVD) process or an atomic layer deposition (ALD) process.

According to an embodiment of the present invention, the step of driving the germanium atoms of the germanium-based semiconductor layer into the underlying layers includes performing a high-temperature oxidation, a rapid thermal annealing (RTA) or a laser annealing.

According to an embodiment of the present invention, the germanium-based semiconductor layer includes germanium or silicon germanium.

According to an embodiment of the present invention, each of the first and second semiconductor nanowires includes a silicon nanowire, and each of the first and second semiconductor blocks includes a silicon block.

According to an embodiment of the present invention, the nanowire with stress includes a germanium nanowire or a silicon germanium nanowire, and the blocks with stress comprise germanium blocks or silicon germanium blocks.

According to an embodiment of the present invention, the step of forming the first semiconductor nanowire, the first semiconductor blocks, the second semiconductor nanowire and the second semiconductor blocks includes the following steps. At least one stripe-shaped insulating pattern is formed on a substrate in each of the first and second areas. A hard mask layer is formed on the substrate covering the stripe-shaped insulating patterns. Two photoresist blocks are formed corresponding to two ends of each of the stripe-shaped insulating patterns. A portion of the hard mask layer is removed by using the photoresist blocks as a mask, so as to form two mask spacers beside each stripe-shaped insulating pattern and define two mask blocks below the photoresist blocks. The photoresist blocks and stripe-shaped insulating patterns are removed. A portion of the substrate is removed by using the mask spacers and the mask blocks as a mask. The mask spacers and the mask blocks are removed to form the first and second semiconductor nanowires and the first and second semiconductor blocks. Another portion of the substrate below the first and second semiconductor nanowires is removed.

According to an embodiment of the present invention, the substrate includes a silicon-on-insulator (SOI) substrate.

According to an embodiment of the present invention, the first area is an N-type device area, and the second area is a P-type device area.

According to an embodiment of the present invention, the first semiconductor blocks serve as source/drain regions of an N-type device, and the blocks with stress serve as source/drain regions of a P-type device.

In view of the above, the method of the invention is simple, and the tensile stress for an N-type channel and the compression stress for a P-type channel can be defined at the same time by adopting few process steps. The individual patterning steps for defining the N-type and P-type channels are not necessary, so the process cost can be effectively reduced and the competitive advantage can be easily achieved.

Several exemplary embodiments accompanied with figures are described in detail below to further describe the present invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
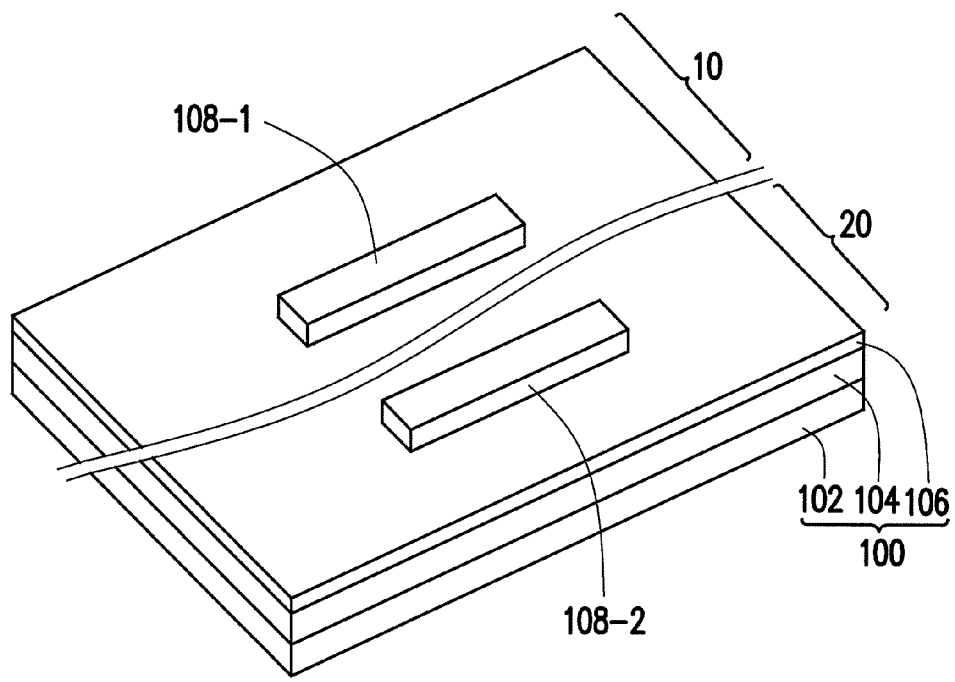
FIG. 1A to FIG. 1F are schematic perspective views illustrating a method of forming suspended nanowires according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic perspective views illustrating a method of forming suspended nanowires according to an embodiment of the invention.

Referring to FIG. 1A, a substrate 100 is provided. The substrate 100 can be a semiconductor substrate, such as a silicon-containing substrate. In an embodiment, the substrate 100 can a silicon-on-insulator (SOI) substrate including a base substrate 102, a buried oxide layer 104 and an upper layer 106. In an embodiment, each of the base substrate 102 and the upper layer 106 is a silicon-based layer, such as a silicon layer. The substrate 100 has a first area 10 and a second area 20. In an embodiment, the first area 10 is an N-type device area, and the second area 20 is a P-type device area.

Thereafter, at least one stripe-shaped insulating pattern 108-1 is formed on the substrate 100 in the first area 10, and at least one stripe-shaped insulating pattern 108-2 is formed on the substrate 100 in the second area 20. In an embodiment, the stripe-shaped insulating patterns 108-1 and 108-2 include silicon oxide and can be formed through a chemical vapor deposition (CVD) step followed by photolithography etching steps.

Figure 1B:
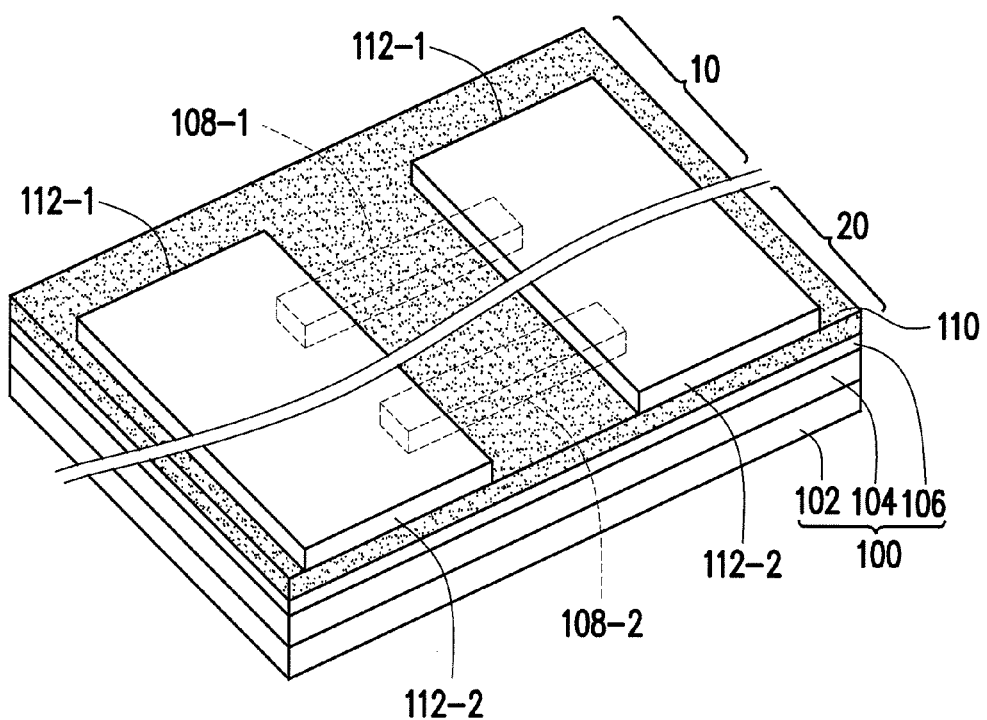

Referring to FIG. 1B, a hard mask layer 110 is formed on the substrate 100 covering the stripe-shaped insulating patterns 108-1 and 108-2. In an embodiment, the hard mask layer 110 includes silicon nitride and can be formed through a CVD step. Thereafter, two photoresist blocks 112-1 are formed corresponding to two ends of the stripe-shaped insulating pattern 108-1, and two photoresist blocks 112-2 are formed corresponding to two ends of the stripe-shaped insulating pattern 108-2. The photoresist blocks 112-1 and 112-2 include the same material and can be formed in the same process step.

Figure 1C:
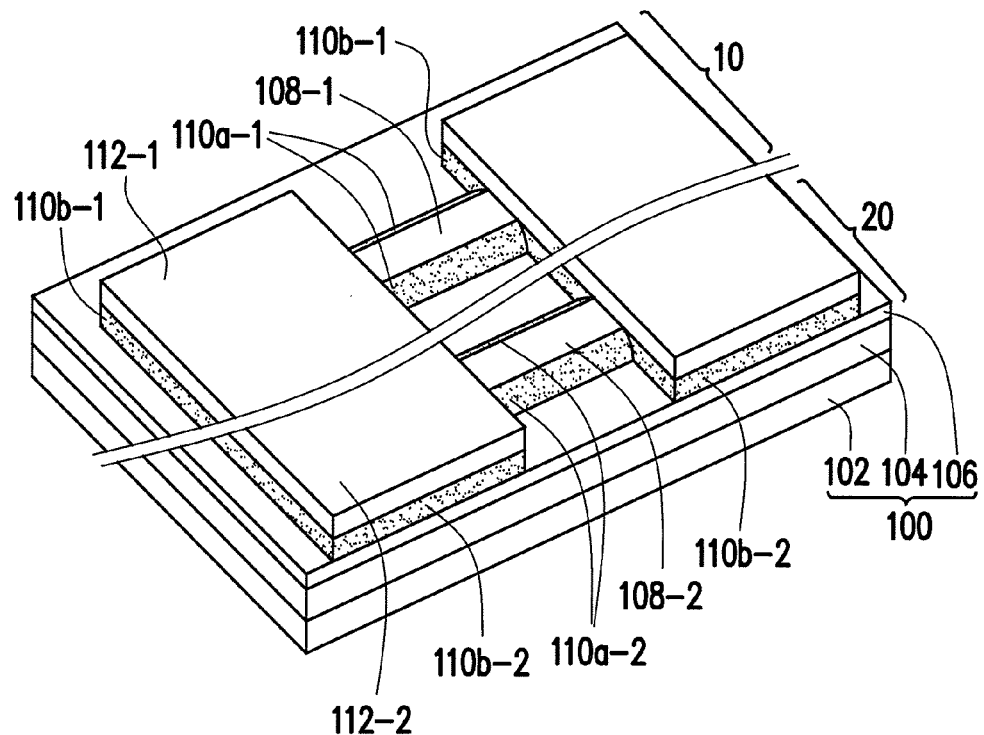

Referring to FIG. 1C, a portion of the hard mask layer 110 is removed by using the photoresist blocks 112-1 and 112-2 as a mask, and thus, two mask spacers 110a-1 are formed beside the stripe-shaped insulating pattern 108-1 and two mask blocks 110b-1 are defined below the photoresist blocks 112-1. In the meanwhile, two mask spacers 110a-2 are formed beside the stripe-shaped insulating pattern 108-2 and two mask blocks 110b-2 are defined below the photoresist blocks 112-2. In an embodiment, the removing step includes performing an anisotropic etching such as a reactive-ion etching (RIE) step.

Figure 1D:
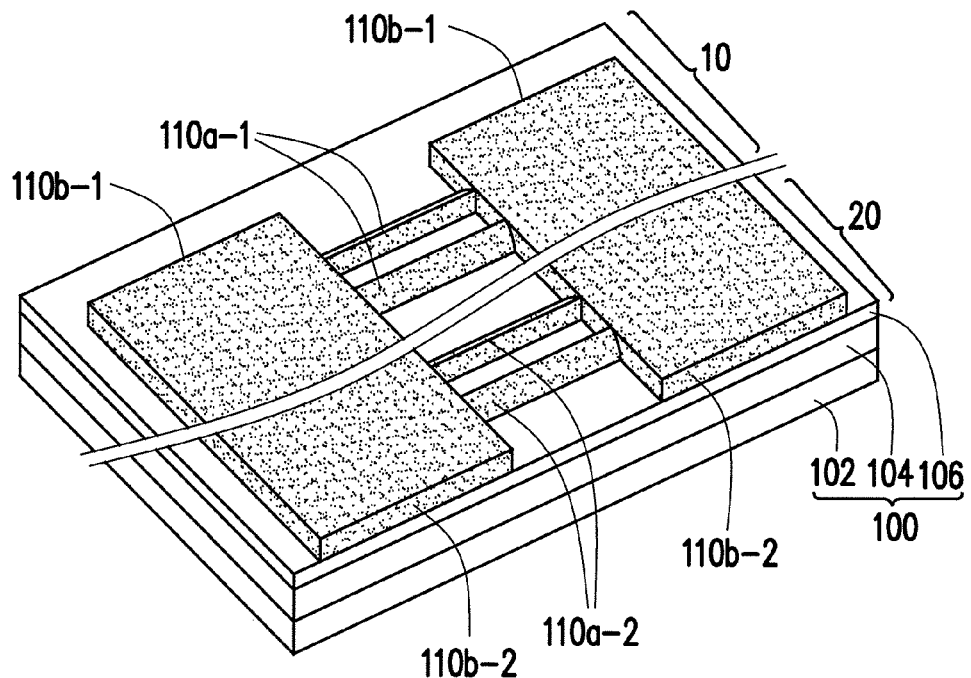

Referring to FIG. 1D, the photoresist blocks 112-1 and 112-2 and the stripe-shaped insulating patterns 108-1 and 108-2 are removed. The removing step includes performing an isotropic etching such as a wet etching step.

Figure 1E:
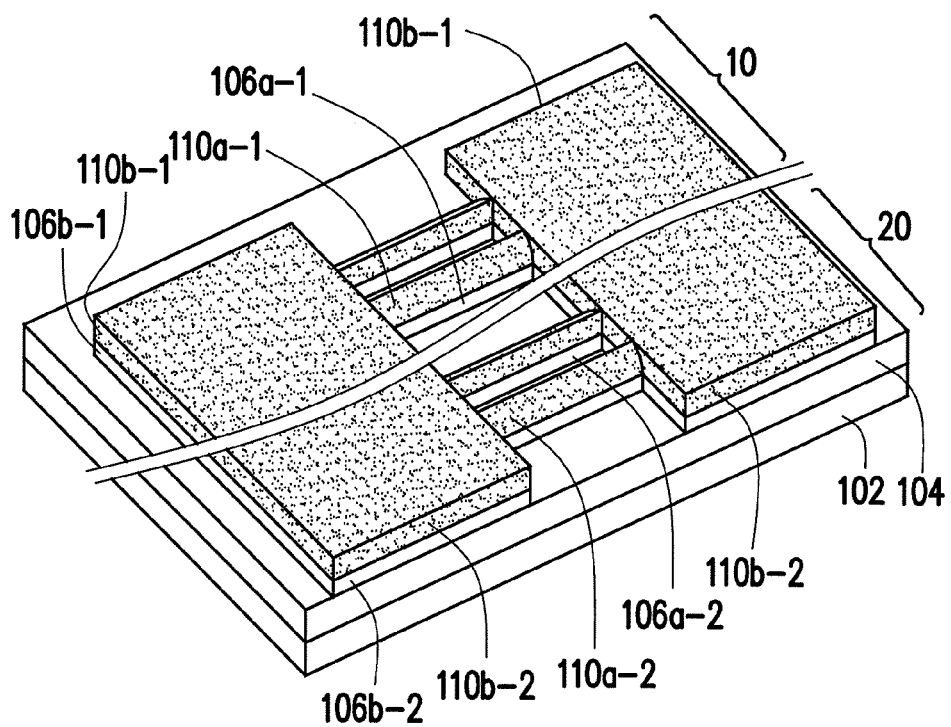

Referring to FIG. 1E, a portion of the upper layer 106 of the substrate 100 is removed by using the mask spacers 110a-1 and 110a-2 and the mask blocks 110b-1 and 110b-2 as a mask. The removing step includes performing an isotropic etching such as a dry etching step. The remaining upper layer 106 has a shape corresponding to the shape of the mask spacers 110a-1 and 110a-2 and the mask blocks 110b-1 and 110b-2. Specifically, upon the removing step, two first silicon-based nanowire 106a-1 and two first silicon-based blocks 106b-1 at two ends of each first silicon-based nanowire 106a-1 are formed in the first area 10, and two second silicon-based nanowire 106a-2 and two second silicon-based blocks 106b-2 at two ends of each second silicon-based nanowire 106a-2 are formed in the second area 20.

Figure 1F:
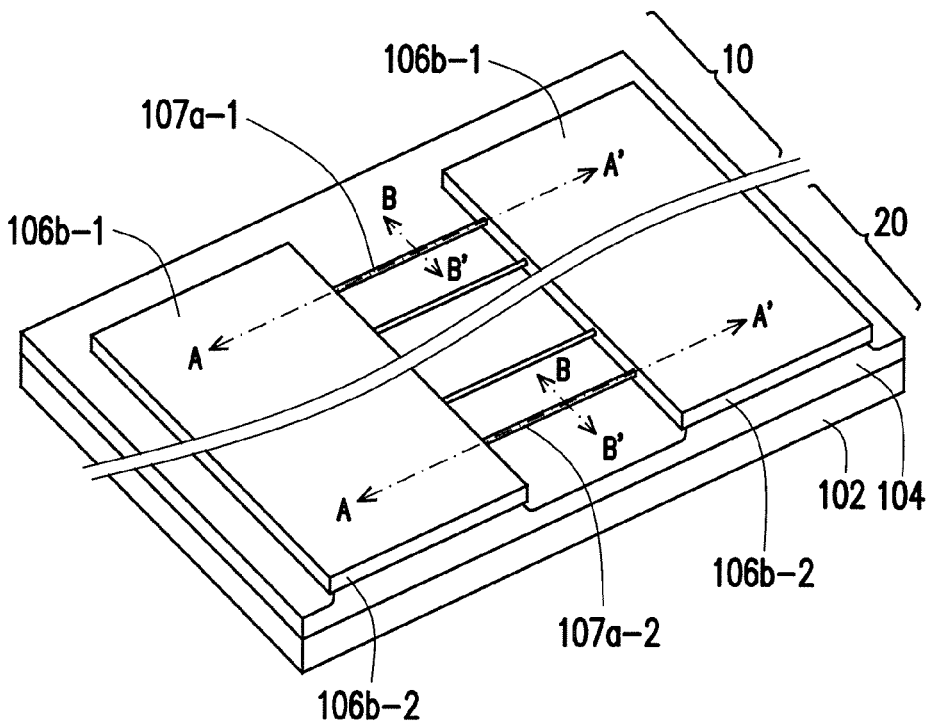

Referring to FIG. 1F, the mask spacers 110a-1 and 110a-2 and the mask blocks 110b-1 and 110b-2 are removed through a wet etching step. Thereafter, a portion of the buried oxide layer 104 of the substrate 100 below the first and second silicon-based nanowires 106a-1 and 106a-2 is removed through an isotropic etching by using, for example, a diluted hydrofluoric acid (DHF) solution. The isotropic etching suspends the first and second silicon-based nanowires 106a-1 and 106a-2 above the remaining buried oxide layer 104. The isotropic etching results in a lateral etching of the buried oxide layer 104 and forms undercuts below the edge portions of the first and second silicon-based blocks 106b-1 and 106b-2. Thereafter, the first and second silicon-based nanowires 106a-1 and 106a-2 are smoothened or rounded, so as to form elliptical or cylindrical shaped first and second silicon-based nanowires 107a-1 and 107a-2 that are suspended above the buried oxide layer 104 by the first and second and second silicon-based blocks 106b-1 and 106b-2. The smoothing or rounding step includes performing an annealing at a temperature of about 600 to 900° C., in the presence of hydrogen or oxygen.

In this embodiment, the number of the suspended nanowires (e.g., 107a-1 and 107a-2) is two times the number of the initial stripe-shaped patterns (e.g., 108-1 and 108-2), and the pitch between the suspended nanowires (e.g., 107a-1 and 107a-2) is about one-half of the pitch between the initial stripe-shaped patterns (e.g., 108-1 and 108-2). That is, more number and smaller size of suspended nanowires can be easily obtained with the steps described above.

FIG. 2A to FIG. 2E are schematic cross-sectional views, taken along the line A-A' of FIG. 1F, of a method of forming a semiconductor device according to an embodiment of the present invention. FIG. 3A to FIG. 3E are schematic cross-sectional views, taken along the line B-B' of FIG. 1F, of a method of forming a semiconductor device according to an embodiment of the present invention.

Figure 2A:
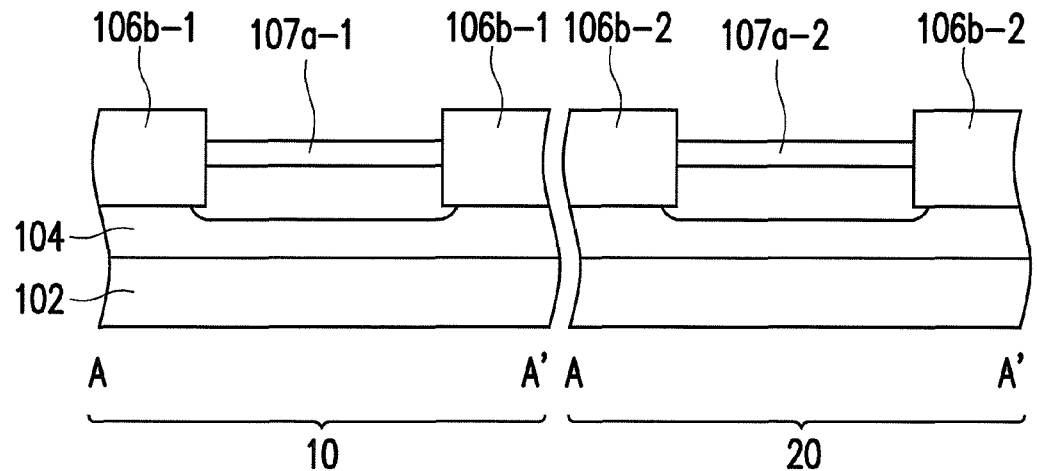
FIG. 2A to FIG. 2E are schematic cross-sectional views, taken along the line A-A' of FIG. 1F, of a method of forming a semiconductor device according to an embodiment of the present invention.
Figure 3A:
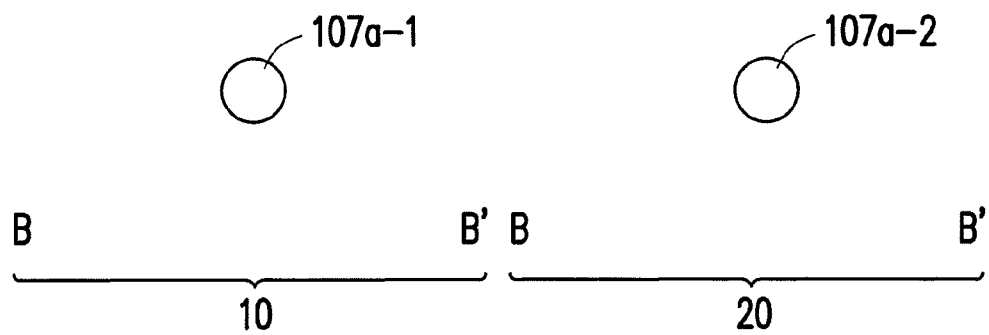
FIG. 3A to FIG. 3E are schematic cross-sectional views, taken along the line B-B' of FIG. 1F, of a method of forming a semiconductor device according to an embodiment of the present invention.

Referring to FIG. 2A and FIG. 3A, at least one suspended first silicon-based nanowire 107a-1 and two first silicon-based blocks 106b-1 at two ends of the first silicon-based nanowire 107a-1 is provided in the first area 10, and at least one suspended second silicon-based nanowire 107a-2 and two second silicon-based blocks 106b-2 at two ends of the second silicon-based nanowire 107a-2 are provided in the second area 20. In an embodiment, the first and second silicon-based nanowires 107a-1 and 107a-2 are suspended above a buried oxide layer 104 on a base substrate 102. In an embodiment, each of the first and second silicon-based nanowires 107a-1 and 107a-2 is a silicon nanowire, and each of the first and second silicon-based blocks 106b-1 and 106b-2 is a silicon block.

Figure 2B:
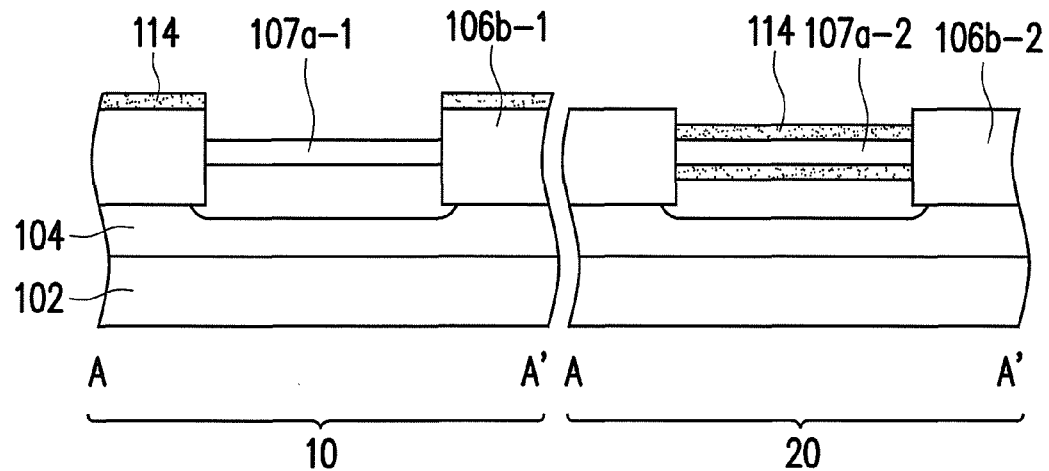
Figure 3B:
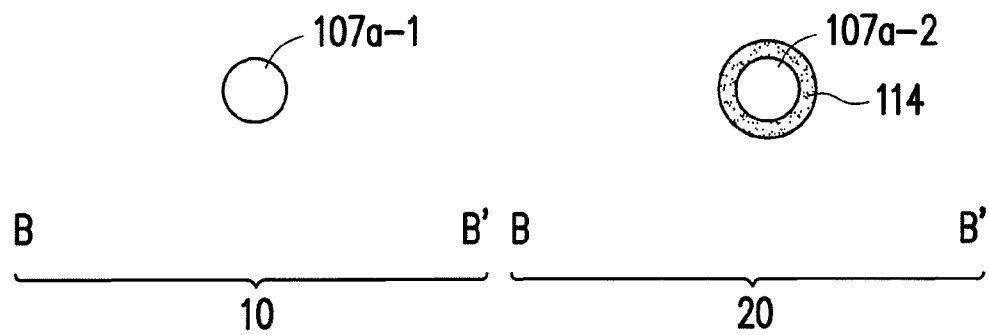

Referring to FIG. 2B and FIG. 3B, a mask layer 114 is formed on surfaces of the first silicon-based blocks 106b-1 and on a surface of the second silicon-based nanowire 107a-2. The mask layer 114 includes an oxide layer such as a silicon oxide layer or a nitride layer such as a silicon nitride layer. The method of forming the mask layer 114 includes forming a mask material layer through a thermal oxidation or a CVD deposition, and then removing a portion of the mask material layer by photolithography and etching steps.

Figure 2C:
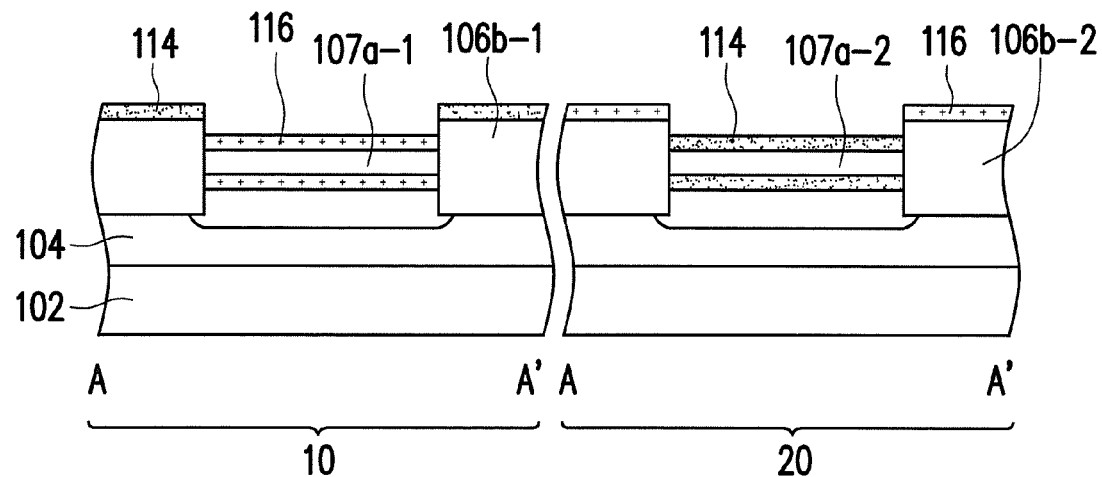
Figure 3C:
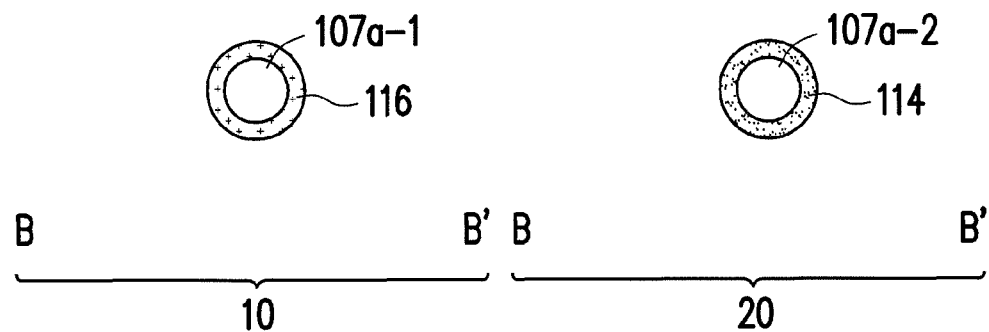

Referring to FIG. 2C and FIG. 3C, a germanium-based semiconductor layer 116 is formed on a surface of the first silicon-based nanowire 107a-1 and on surfaces of the second silicon-based blocks 106b-2. The germanium-based semiconductor layer 116 includes germanium or silicon germanium. In an embodiment, the germanium-based semiconductor layer 116 is formed through a selective epitaxial growth (SEG) process. In the selective epitaxial growth of germanium or silicon germanium, growth occurs only on the exposed areas not covered by the mask layer 116, and thus, the germanium-based semiconductor layer 116 is formed only on the surfaces of the first silicon-based nanowire 107a-1 and second silicon-based blocks 106b-2. In another embodiment, the germanium-based semiconductor layer 116 is formed through a suitable deposition process such as a CVD process, a physical vapor deposition (PVD) process or an atomic layer deposition (ALD) process. In such case, the CVD, PVD or ALD germanium-based layer is formed not only on the surfaces of the first silicon-based nanowire 107a-1 and second silicon-based blocks 106b-2 but also on the surface of the mask layer 116. The mask layer 116 is then removed through an etching step. In an embodiment, a portion of the CVD, PVD or ALD germanium-based layer on the mask layer 116 can be simultaneously removed during the etching step.

Figure 2D:
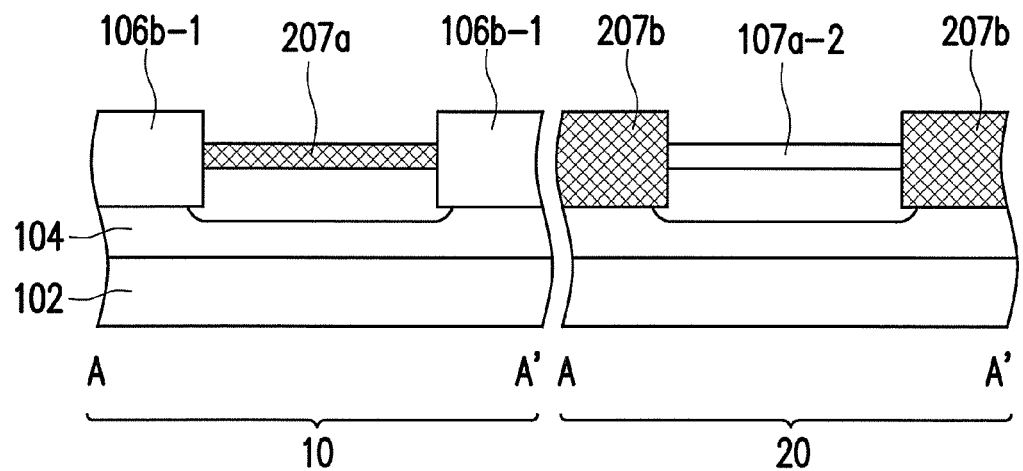
Figure 3D:
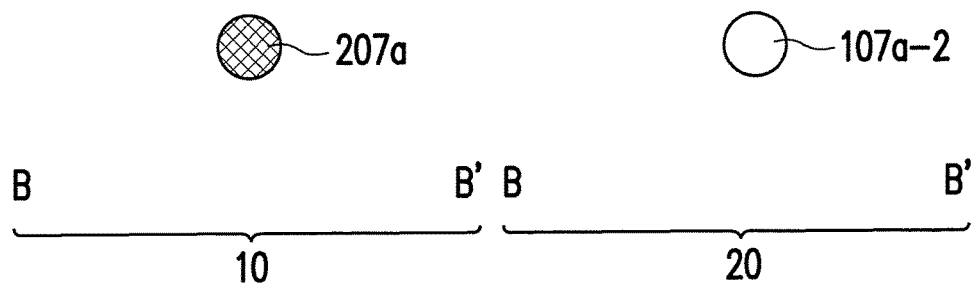

Referring to FIG. 2D and FIG. 3D, germanium atoms of the germanium-based semiconductor layer 116 are driven into underlying layers, so the first silicon-based nanowire 107a-1 is transformed into a germanium-based nanowire 207a and the second silicon-based blocks 106b-2 are transformed into two germanium-based blocks 207b. In an embodiment, the step of driving the germanium atoms of the germanium-based semiconductor layer 116 into the underlying layers includes performing a high-temperature oxidation, a rapid thermal annealing (RTA) or a laser annealing. The high-temperature oxidation is conducted at a temperature of about 600 to 900° C. In an embodiment, the germanium-based nanowire 207a is a germanium nanowire or a silicon germanium nanowire, and the germanium-based blocks 207b are germanium blocks or silicon germanium blocks.

In an embodiment, the silicon-based components covered by the germanium-based semiconductor layer 116 is completely transformed into germanium-based components, but the present invention is not limited thereto. In another embodiment, partially transforming is possible as long as the desired performance can be obtained. Thereafter, a surface cleaning step is performed through a wet etching.

Figure 2E:
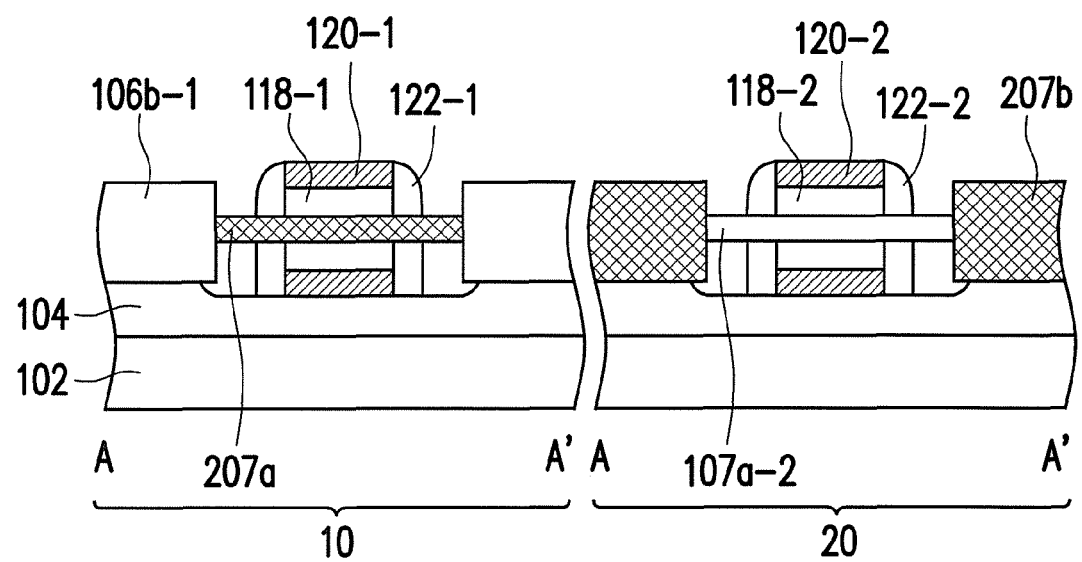
Figure 3E:
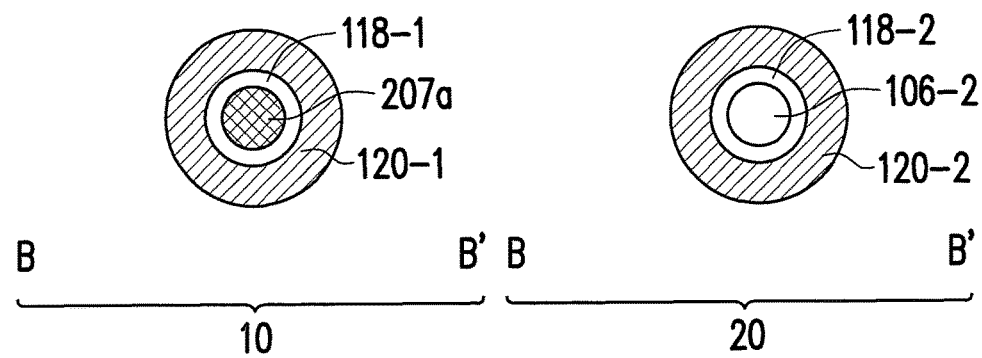

Referring to FIG. 2E and FIG. 3E, first and second gate dielectric layers 118-1 and 118-2 are formed respectively on surfaces of the germanium-based nanowire 207a and the second silicon-based nanowire 107a-2. In an embodiment, the first and second gate dielectric layers 118-1 and 118-2 include the same material and can be formed by the same process step. In another embodiment, the first and second gate dielectric layers 118-1 and 118-2 are made from different materials and formed by different process steps. In an embodiment, each of the first and second gate dielectric layers 118-1 and 118-2 includes an interfacial layer and/or a high-dielectric-constant (high-k) material. The interfacial layer includes silicon oxide. The high-k material is a dielectric material having a dielectric constant greater than 4, greater than 7 or greater than 10. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The method of forming each of the first and second gate dielectric layers 118-1 and 118-2 includes performing a thermal oxidation or a suitable deposition process such as CVD or ALD, or a combination thereof.

Thereafter, at least one first gate 120-1 is formed across the germanium-based nanowire 207a, and at least one second gate 120-2 is formed across the second silicon-based nanowire 107a-2. In an embodiment, the first and second gates 120-1 and 120-2 extend in direction different from, e.g., perpendicular to, the longitude direction of the nanowires. The first and second gates 120-1 and 120-2 include polysilicon, metal or a combination thereof. In an embodiment, each of the first and second gates 120-1 and 120-2 is a metal gate including a work function metal (e.g., TiN or TiAl) and a low resistivity metal (e.g., Al or Cu). The method of forming each of first and second gates 120-1 and 120-2 includes performing a suitable deposition process such as CVD or ALD.

Afterwards, first spacers 122-1 are formed beside the first gate 120-1 and across the germanium-based nanowire 207a, and second spacers 122-2 are formed beside the second gate 120-2 and across the second silicon-based nanowire 107a-2. The first and second spacers 122-1 and 122-2 include the same material and can be formed by the same process step.

In an embodiment, the first silicon-based blocks 106b-1 serve as source/drain regions of an N-type device in the first area 10, and the germanium-based blocks 207b serve as source/drain regions of a P-type device in the second area 20. In an embodiment, the germanium-based nanowire 207a serves as an N-type channel of the N-type device, and the second silicon-based nanowire 107a-2 serves as a P-type channel of the N-type device.

Figure 4:
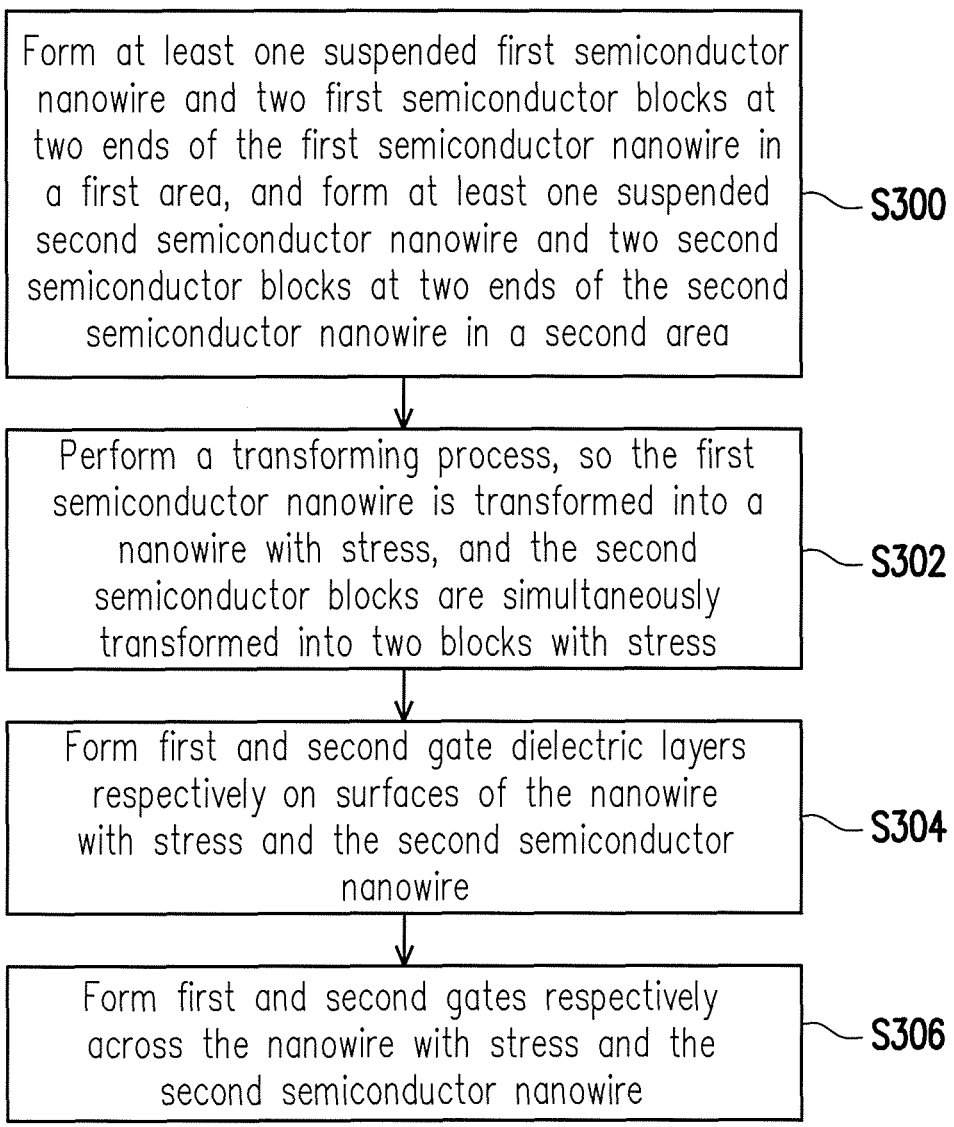
FIG. 4 is a flow chart of a method of forming a semiconductor device according to another embodiment of the present invention.

The present invention further provides a method of forming a semiconductor device. FIG. 4 is a flow chart of a method of forming a semiconductor device according to another embodiment of the present invention.

At step S300, at least one suspended first semiconductor nanowire (e.g., first silicon-based nanowire 107a-1) and two first semiconductor blocks (e.g., first silicon-based blocks 106b-1) at two ends of the first semiconductor nanowire are formed in the first area 10, and at least one suspended second semiconductor nanowire (e.g., second silicon-based nanowire 107a-2) and two second semiconductor blocks (e.g., second silicon-based blocks 106b-2) at two ends of the second semiconductor nanowire are formed in the second area 20, as shown in FIG. 2A.

At step S302, a transforming process (e.g., the steps in FIG. 2B to FIG. 2D) is performed, so the first semiconductor nanowire (e.g., first silicon-based nanowire 107a-1) is transformed into a nanowire with stress (e.g., germanium-based nanowire 207a) and the second semiconductor blocks (e.g., second silicon-based nanowire 107a-2) are simultaneously transformed into two blocks with stress (e.g., germanium-based blocks 207b).

In an embodiments, the transforming process includes forming an oxide layer (e.g., the mask layer 114) on surfaces of the first semiconductor blocks and on a surface of the second semiconductor nanowire, forming a germanium-based semiconductor layer 116 on a surface of the first semiconductor nanowire and on surfaces of the second semiconductor blocks, removing the oxide layer, and driving germanium atoms of the germanium-based semiconductor layer into underlying layers.

At step S304, first and second gate dielectric layers 118-1 and 118-2 are formed respectively on surfaces of the nanowire with stress and the second semiconductor nanowire, as shown in FIG. 2E.

At step S306, first and second gates 120-1 and 120-2 are formed respectively across the nanowire with stress and the second semiconductor nanowire, as shown in FIG. 2E.

In summary, in the present invention, the germanium nanowire and germanium source/drains in different device areas can be simultaneously formed with the transforming process described above, and thus, the tensile stress for an N-type channel and the compression stress for a P-type channel can be easily provided for the N-type and P-type devices. With the method of the invention, a gate-all-around (GAA) nanowire FET device including N-type and P-type devices can be easily formed. The individual pattering steps for defining the N-type and P-type channels are not necessary, so the process cost can be effectively reduced and the competitive advantage can be easily achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
  forming at least one suspended first silicon-based nanowire and two first silicon-based blocks at two ends of the first silicon-based nanowire in a first area, and forming at least one suspended second silicon-based nanowire and two second silicon-based blocks at two ends of the second silicon-based nanowire in a second area;
  forming a germanium-based semiconductor layer on a surface of the first silicon-based nanowire and on surfaces of the second silicon-based blocks;
  driving germanium atoms of the germanium-based semiconductor layer into underlying layers, so the first silicon-based nanowire is transformed into a germanium-based nanowire and the second silicon-based blocks are transformed into two germanium-based blocks;
  forming a first gate dielectric layer and a second gate dielectric layer respectively on surfaces of the germanium-based nanowire and the second silicon-based nanowire; and forming at least one first gate across the germanium-based nanowire and forming at least one second gate across the second silicon-based nanowire, wherein the first area is an N-type device area, and the second area is a P-type device area.

2. The method of claim 1, wherein the step of driving the germanium atoms of the germanium-based semiconductor layer into the underlying layers comprises performing a high-temperature oxidation, a rapid thermal annealing (RTA) or a laser annealing.

3. The method of claim 1, wherein the germanium-based semiconductor layer comprises germanium or silicon germanium.

4. The method of claim 1, wherein the first silicon-based blocks serve as source/drain regions of an N-type device, and the germanium-based blocks serve as source/drain regions of a P-type device.

5. The method of claim 1, wherein the step of forming the germanium-based semiconductor layer on the surface of the first silicon-based nanowire and on the surfaces of the second silicon-based blocks comprises:

forming a mask layer on surfaces of the first silicon-based blocks and on a surface of the second silicon-based nanowire;

performing a selective epitaxial growth (SEG) process; and removing the mask layer.

6. The method of claim 5, wherein the mask layer comprises an oxide layer or a nitride layer.

7. The method of claim 1, wherein the step of forming the first silicon-based nanowire, the first silicon-based blocks, the second silicon-based nanowire and the second silicon-based blocks comprises:

forming at least one stripe-shaped insulating pattern on a substrate in each of the first and second areas;

forming a hard mask layer on the substrate, the hard mask layer covering the stripe-shaped insulating patterns;

forming two photoresist blocks that correspond to two ends of each of the stripe-shaped insulating patterns;

removing a portion of the hard mask layer by using the photoresist blocks as a mask, so as to form two mask spacers beside each stripe-shaped insulating pattern and define two mask blocks below the photoresist blocks;

removing the photoresist blocks and the stripe-shaped insulating patterns;

removing a portion of the substrate by using the mask spacers and the mask blocks as a mask;

removing the mask spacers and the mask blocks to form the first and second silicon-based nanowires and the first and second silicon-based blocks; and removing another portion of the substrate below the first and second silicon-based nanowires.

8. The method of claim 7, wherein the substrate comprises a silicon-on-insulator (SOI) substrate.

9. A method of forming a semiconductor device, comprising:

forming at least one suspended first semiconductor nanowire and two first semiconductor blocks at two ends of the first semiconductor nanowire in a first area, and forming at least one suspended second semiconductor nanowire and two second semiconductor blocks at two ends of the second semiconductor nanowire in a second area;

performing a transforming process, so the first semiconductor nanowire is transformed into a nanowire with stress, and the second semiconductor blocks are simultaneously transformed into two blocks with stress;

forming first and second gate dielectric layers respectively on surfaces of the nanowire with stress and the second semiconductor nanowire; and forming first and second gates respectively across the nanowire with stress and the second semiconductor nanowire, wherein the first area is an N-type device area, and the second area is a P-type device area.

10. The method of claim 9, wherein each of the first and second semiconductor nanowires comprises a silicon nanowire, and each of the first and second semiconductor blocks comprises a silicon block.

11. The method of claim 9, wherein the nanowire with stress comprises a germanium nanowire or a silicon germanium nanowire, and the blocks with stress comprise germanium blocks or silicon germanium blocks.

12. The method of claim 9, wherein the first semiconductor blocks serve as source/drain regions of an N-type device, and the blocks with stress serve as source/drain regions of a P-type device.

13. The method of claim 9, wherein the transforming process comprises:

forming an oxide layer on surfaces of the first semiconductor blocks and on a surface of the second semiconductor nanowire;

forming a germanium-based semiconductor layer on a surface of the first semiconductor nanowire and on surfaces of the second semiconductor blocks;

removing the oxide layer; and driving germanium atoms of the germanium-based semiconductor layer into underlying layers.

14. The method of claim 13, wherein a method of forming the germanium-based semiconductor layer comprises performing a selective epitaxial growth (SEG) process, a chemical vapor deposition (CVD) process, a physical vapor deposition (PVD) process or an atomic layer deposition (ALD) process.

15. The method of claim 13, wherein the step of driving the germanium atoms of the germanium-based semiconductor layer into the underlying layers comprises performing a high-temperature oxidation, a rapid thermal annealing (RTA) or a laser annealing.

16. The method of claim 13, wherein the germanium-based semiconductor layer comprises germanium or silicon germanium.

17. The method of claim 9, wherein the step of forming the first semiconductor nanowire, the first semiconductor blocks, the second semiconductor nanowire and the second semiconductor blocks comprises:

forming at least one stripe-shaped insulating pattern on a substrate in each of the first and second areas;

forming a hard mask layer on the substrate, the hard mask layer covering the stripe-shaped insulating patterns;

forming two photoresist blocks that correspond to two ends of each of the stripe-shaped insulating patterns;

removing a portion of the hard mask layer by using the photoresist blocks as a mask, so as to form two mask spacers beside each stripe-shaped insulating pattern and define two mask blocks below the photoresist blocks;

removing the photoresist blocks and stripe-shaped insulating patterns;

removing a portion of the substrate by using the mask spacers and the mask blocks as a mask;

removing the mask spacers and the mask blocks to form the first and second semiconductor nanowires and the first and second semiconductor blocks; and removing another portion of the substrate below the first and second semiconductor nanowires.

18. The method of claim 17, wherein the substrate comprises a silicon-on-insulator (SOI) substrate.

* * * * *